United States Patent Office 3,574,680
Patented Apr. 13, 1971

3,574,680
HIGH-LOW OHMIC CONTACT DEPOSITION METHOD

John A. Perri and Jacob Riseman, Poughkeepsie, N.Y., assignors to International Business Machines Corporation, Armonk, N.Y.
No Drawing. Filed May 7, 1968, Ser. No. 727,342
Int. Cl. C23c *11/02*; H01k *7/00*
U.S. Cl. 117—212 16 Claims

ABSTRACT OF THE DISCLOSURE

A method of forming an ohmic contact upon an area to be contacted upon a substrate, such as an active area upon a semiconductor device, comprising the steps of depositing from the vapor phase a metal to be deposited, while said area is maintained at a first temperature at which good adhesion between said area and said metal occurs; then completing the deposition at a second lower temperature, for a time during which no contact-impairing reactions may occur between said metal and said area; then cooling the area. Examples of given materials and temperatures are included.

FIELD OF THE INVENTION

Methods for depositing electrical contact materials upon a substrate, such deposition methods including electroplating, vapor deposition, vacuum deposition, spraying, dipping, and coating methods in general.

PRIOR ART

As electrical devices become increasingly sophisticated, so in turn electrical contact materials and electrical contacts per se have become increasingly sophisticated. Such electrical contacts are often but a few ten thousandths of an inch in width and in length, and may be measured in microns as to thickness. This is particularly true in the field of semiconductor devices, where a single small semiconductor device, of the order of .030 by .030 inch square surface area may contain numerous active devices, each of which must be connected to other similar devices. These electrical contacts, in the past, have often been achieved by the use of deposited aluminum striping. This aluminum striping has been deposited by vapor deposition means as the most common method.

In general, such a contact would be built up upon the device, and interleaved with layers of an insulator, so as to form a multilayer device whereby most often the electrical contact material penetrated through various insulating and protective layers to make contact with an active area of such a device.

Vapor depositions in general can be accurately controlled, but adhesion of the deposited material upon the area upon a substrate where it is desired to place the contact has often been a problem. This area often includes surrounding insulating material. As the temperature of the substrate is raised during such deposition, adhesion markedly improves. However, depending upon the materials chosen, a chemical reaction, such as alloying, may occur which impairs the contact resistance between the deposited metal and the area to be contacted. This is noticeable as increased contact resistance. This degradation at the contact area is clearly undesirable. However, if lower temperatures are chosen, adhesion may be poor. Further, as these semiconductor devices are being utilized at higher and higher temperatures, it is necessary to utilize temperature stable contact materials that do not interact with the materials comprising the active area or any contact upon said active area to which said contact materials make contact, at these elevated temperatures. Similarly, it must be possible to deposit a sufficiently thick coating of the electrical contact material so that the line conductivity is adequate for the purpose for which it is desired.

Thus, a prime requisite in the depositing of such ohmic contact upon a semiconductor device, or upon any material in general, is that the contact resistance be as low as possible between the two materials. Conversely, one must make every effort to eliminate or avoid any contact-impairing reaction, which is broadly defined to be any chemical or physical reaction causing an increase in the electrical resistance at the contact junction between the materials being deposited and the material comprising the area being contacted.

Thus, it is an object of this invention, to eliminate contact resistance problems by a two-step deposition method.

A further object of this invention is to allow a deposited metal to have good adhesion to the area upon which it is deposited without impairing such contact resistance.

Still another object of this invention is to allow deposition of an electrically-conducting material of high electrical conductivity upon a given area while maintaining good adhesion and low contact resistance.

SUMMARY OF THE INVENTION

These and other objects are met by the method of this invention. Briefly, this method comprises two steps:

First, vapor depositing an electrical contact material upon a substrate maintained at a first temperature at which good adhesion will occur; and then Second, continuing the deposition while the substrate is lowered to and maintained at a second temperature lower than said first temperature, deposition being continued for a time such that at said second temperature no contact-impairing reactions may occur, until the desired thickness of the deposited material is achieved, and then cooling. By this method, for example, adherent contacts of molybdenum upon a platinum silicide contact previously deposited upon an active area of a semiconductor device, may be made.

These and other objects, features, and advantages of the invention will be apparent from the following more particular description of preferred embodiments of the invention, as illustrated in the general description.

GENERAL DESCRIPTION

It has long been known that in depositing a metal, or an electrical conductor in general, upon a semiconductor device, good adhesion and good conductivity of the deposited metal is most often achieved when the deposition is carried out at a relatively high temperature. However, poor contact resistance, defined as a high contact resistance, most often accompanies such deposition. Conversely, moderate conductivity with poor adhesion occurs when such depositions are done at low temperatures.

Contact-impairing reactions may include, for example, actual alloying between the material being deposited and the material comprising the area upon which the electrical conductor is being deposited. This alloying can result in the formation of many different phases of material, but the result is an increase in contact resistance. This is but one of many ways in which increased contact resistance can occur.

Materials having a high conductivity compared to most materials comprise gold, silver, molybdenum, tungsten, and aluminum. Molybdenum and tungsten are both relatively stable at high temperatures, and, coupled with the good electrical conductivity of these materials, are naturally desirable for use as contact materials upon such devices as semiconductor monolithic devices. Adhesion of molybdenum upon a semiconductor device is best obtained at high temperatures, but if deposition of molybdenum is carried out at temperatures greater than 550–600° C. for any extended period of time, contact resistance due to alloying between the molybdenum and the semiconductor device itself causes innumerable problems. In one form of a semiconductor device, holes have been etched in the protective insulating layers, over the active areas of said device, and are filled with platinum silicide, or palladium silicide, as the initial contact to such areas. Where deposition of the contact is to overlap onto the surrounding insulator, most usually $SiO_2$, as is often the case, adhesion to this insulator must also be good.

It is desirable to use molybdenum as a material to contact these initial contact materials, for further ohmic contact.

Thus, in attempting to make a molybdenum contact to a platinum silicide or palladium silicide contact upon an active area on a silicon wafer substrate, we have found that starting by heating the substrate to an initial temperature in the region between 575–625° C., with 600° C. as a preferred embodiment, while depositing a few hundred angstroms of molybdenum from a reduction reaction of molybdenum pentachloride plus hydrogen, results in very good adhesion of the molybdenum to the platinum silicide and surrounding insulators, such as $SiO_2$, $Si_3N_4$, or other oxides or nitrides. This reaction is: $2MoCl_5+5H_2 \rightarrow 2Mo+10HCl$. After this initial deposition, the time of which, of course, is dependent upon the deposition rate, the temperature of the area upon the substrate upon which deposition is occurring, here the platinum silicide area, is lowered as quickly as possible to a range between 475–550° C., with a preferred temperature being 525° C., while deposition is continued until a final thickness of between ½–2 microns thickness of molybdenum has been deposited upon that area. Thicker or thinner deposits, of course, may be deposited as desired. The deposition is then stopped and the substrate cooled to room temperature.

Where palladium silicide is utilized in place of platinum silicide, certain lower temperatures would have to be used as opposed to platinum silicide.

While the above example shows the use of molybdenum upon platinum silicide, or palladium silicide, certain generalities may be stated as requisite in this two-step process. These requisites are that the initial temperature must be chosen at a temperature at which good adhesion will occur between the electrical contact material being deposited and the material comprising the area upon the substrate upon which the metal is being deposited; the time of deposition at this first temperature must be chosen such that no contact-impairing reactions will occur; the temperature must then be dropped to a second lower temperature, during which time deposition may be maintained, this second temperature being maintained for a length of a time sufficient to allow deposition to the desired thickness of the electrical contact material, and insufficient as a combination in time and temperature for contact-impairing reactions to occur between that initially deposited electrically contacting material and the material comprising the area upon which deposition is occurring. Clearly, these temperatures will vary with the materials involved, and for certain materials, will not be possible at all.

In the specific and preferred example given above, of molybdenum upon platinum silicide for example, the reducing environment from the molybdenum pentachloride reaction prevents oxidation from occurring. The introductoin of nitrogen or oxygen into this system has a deleterious effect, and should be avoided. Cross-sections of contacts made by the above process show excellent electrical contacts between the molybdenum deposited and the platinum silicide, without any visible alloying; and excellent line conductivity of the deposited molybdenum.

The most important feature of the above embodiment, and of the invention in general, is that no contact-impairing reaction is allowed to happen, resulting in a very low contact resistance, which is, of course, extremely desirable, and prior to this invention, extremely difficult to be consistently obtained.

It is also felt that the nucleating effects of the initial high temperature deposition influences the subsequent conductivity of later deposited material so that the resulting film has better conductivity than would be obtained by working solely at the lowest temperature as done in the prior art. The mechanism causing this has not been ascertained with any great degree of certainty.

The contact resistance of deposited molybdenum upon the platinum silicide contacts upon an emitter and a base area where deposition was done in the conventional single temperature method was approximately .5 ohm upon an N+ emitter and 6 ohms upon a P+ base contact for a 2 mil diameter contact hole, where deposition temperature was 525° C. Adhesion at this temperature, by the "Scotch tape" test, was marginal. Adhesion at a deposition temperature of 575° C. was better, but contact resistance was high, with visible signs of alloying at the contact region. Resistance measurements were made using a 4-point probe "double-L" method.

Utilizing the two-step "high-low" method of this invention, results as tabulated below are achieved. Adhesion is good. Comparison should be made to the emitter and base contacts in the prior paragraph.

| High temperature, ° C. | Low temperature, ° C. | Thickness, microns, μ | Emitter R, ohm | Base R, ohm |
|---|---|---|---|---|
| 600 | 525 | 0.6 | 0.09 | 6.6 |
| 575 | 500 | 0.6 | 0.12 | 7.0 |
| 575 | 500 | 0.6 | 0.13 | 5.8 |
| 575 | 500 | 1.5 | 0.13 | 5.3 |
| 575 | 500 | 0.6 | 0.11 | 5.7 |
| 575 | 500 | 1.3 | 0.10 | 5.4 |

Significant improvement is consistently obtained by utilizing the method of this invention.

While this invention has been particularly described in relation to its use upon semiconductor devices, it is clear that this two-step process may be utilized over a wide range of products where it is desired to deposit an electrical contact upon a given area of a given product or part. For example, the deposition of refractory metals for wear resistance purposes upon general contact materials may be made in this manner. Other examples will readily come to mind to those skilled in the art.

Further, deposition methods clearly include sputtering and convention vacuum deposition. Both molybdenum and tungsten may be deposited in this manner. Tungsten is another excellent conductor for use such as shown with molybdenum, above.

While the invention has been particularly shown and described with reference to preferred embodiments thereof, it will be understood by those skilled in the art that various changes in form and details may be made therein without departing from the spirit and scope of the invention.

What is claimed is:

1. A method of forming an ohmic contact upon an active area upon a semiconductor device comprising the steps of:

depositing by vapor deposition means an electrically conducting material onto said active area upon said device, the temperature of said active area being initially maintained at a first temperature sufficient for good adhesion to occur betwen the material comprising said active area and said electrically conducting material, and for a time sufficient to allow said good adhesion to occur and insufficient to allow any contact-impairing reaction to occur between said material comprising said active area and said electrically conducting material, then reducing the temperature of said active area to a second temperature lower than said first temperature, at a cooling rate so as to continue to avoid allowing any of said contact-impairing reactions to occur during cooling while continuing to deposit said electrically conducting material, said second temperature being selected to be below that temperature at which said contact-impairing reactions may occur within such time as is necessary to achieve a desired deposited thickness of said electrically conducting material, then terminating said vapor deposition and cooling said given area.

2. The method of claim 1 wherein said vapor deposition means comprises the reduction of molybdenum pentachloride by hydrogen, resulting in deposition of molybdenum upon said given area, said molybdenum now being said electrically conducting material.

3. The method of claim 2 wherein said material comprising said given area is platinum silicide.

4. The method of claim 2 wherein said first temperature is essentially betwen 575–625° C.; and said second temperature is essentially between 475–550° C.

5. The method of claim 4 wherein said first temperature is essentially 600° C. and said second temperature is essentially 525° C.

6. The method of claim 2 wherein said desired deposited thickness is essentially between ½–2 microns.

7. The method of claim 2 wherein said material comprising said given area is palladium silicide.

8. The method of claim 1 wherein said electrically conductive material deposited onto said active area is chosen from the group comprising molybdenum and tungsten.

9. As an article of manufacture, the semiconductor device having an ohmic contact thereon made by the method of claim 1.

10. A method of forming an ohmic contact upon a given area to be contacted so as to produce a contact having good adhesion in said given area, high electrical conductivity, and low electrical contact resistance between the materials comprising said given area and said contact comprising the steps of:

depositing by vapor deposition means an electrically conducting material onto a given area to be contacted upon a substrate, the temperature of said given area being initially maintained at a first temperature sufficient for good adhesion to occur between the materials comprising said given area and said electrically conducting material, and for a time sufficient to allow said good adhesion to occur and insufficient to allow any contact-impairing reactions to occur between said material comprising said given area and said electrically conducting material, then reducing the temperature of said given area to a second temperature lower than said first temperature at a cooling rate so as to continue to avoid allowing any of said contact-impairing reactions to occur during cooling while continuing to deposit said electrically conducting material, said second temperature being selected to be below said temperature at which said contact-impairing reactions may occur within such time as is necessary to achieve a desired deposited thickness on said electrically conducting material, then terminating said vapor deposition and cooling said given area.

11. The method of claim 10 wherein said vapor deposition means comprises the reduction of molybdenum pentachloride by hydrogen, resulting in deposition of molybdenum upon said given area, said molybdenum now being said electrically conducting material.

12. The method of claim 11 wherein said material comprising said given area is platinum silicide.

13. The method of claim 11 wherein said first temperature is essentially between 575–625° C.; and said second temperature is essentially between 475–550° C.

14. The method of claim 12 wherein said first temperature is essentially 600° C. and said second temperature is essentially 525° C.

15. The method of claim 11 wherein said desired deposited thickness is essentially between ½–2 microns.

16. The method of claim 11 wherein said material comprising said given area is palladium silicide.

References Cited

UNITED STATES PATENTS

| | | | |
|---|---|---|---|
| 3,434,020 | 3/1969 | Ruggiero | 317—234 |
| 3,399,331 | 8/1968 | Multer et al. | 317—234 |
| 3,375,418 | 3/1968 | Garnache et al. | 117—212 |
| 3,274,670 | 9/1966 | Lepselter | 29—155.5 |
| 3,031,338 | 4/1962 | Bourdeau | 117—107.2 |

ALFRED L. LEAVITT, Primary Examiner

A. GRIMALDI, Assistant Examiner

U.S. Cl. X.R.

117—107.2, 227; 317—234